United States Patent
Fujita et al.

(10) Patent No.: US 9,799,526 B2
(45) Date of Patent: Oct. 24, 2017

(54) LIQUID COMPOSITION AND ETCHING METHOD FOR ETCHING SILICON SUBSTRATE

(71) Applicant: CANON KABUSHIKI KAISHA, Tokyo (JP)

(72) Inventors: Hirohisa Fujita, Saitama (JP); Taichi Yonemoto, Isehara (JP); Shuji Koyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/798,024

(22) Filed: Jul. 13, 2015

(65) Prior Publication Data
US 2016/0020113 A1    Jan. 21, 2016

(30) Foreign Application Priority Data

Jul. 18, 2014 (JP) .................. 2014-148110

(51) Int. Cl.
| | | |
|---|---|---|
| *H01B 13/00* | (2006.01) | |
| *B23P 15/00* | (2006.01) | |
| *C23F 1/00* | (2006.01) | |
| *C03C 25/00* | (2006.01) | |
| *B44C 1/22* | (2006.01) | |
| *H01L 21/302* | (2006.01) | |
| *H01L 21/461* | (2006.01) | |
| *H01L 21/306* | (2006.01) | |
| *H01L 21/768* | (2006.01) | |
| *H01L 21/311* | (2006.01) | |
| *H01L 21/02* | (2006.01) | |
| *H01L 21/288* | (2006.01) | |
| *H01L 21/56* | (2006.01) | |

(Continued)

(52) U.S. Cl.
CPC ........ *H01L 21/30608* (2013.01); *C09K 13/10* (2013.01); *H01L 21/02063* (2013.01); *H01L 21/288* (2013.01); *H01L 21/31116* (2013.01); *H01L 21/568* (2013.01); *H01L 21/67126* (2013.01); *H01L 21/76805* (2013.01); *H01L 21/76816* (2013.01)

(58) Field of Classification Search
None
See application file for complete search history.

(56) References Cited

U.S. PATENT DOCUMENTS

| | | | | |
|---|---|---|---|---|
| 2006/0046088 A1* | 3/2006 | Akram | ................ | H01L 21/288 |
| | | | | 428/620 |
| 2009/0218542 A1* | 9/2009 | Isami | ................ | C09K 13/00 |
| | | | | 252/79.5 |

(Continued)

FOREIGN PATENT DOCUMENTS

| | | |
|---|---|---|
| JP | 2009-206335 A | 9/2009 |
| JP | 2010-278371 A | 12/2010 |

*Primary Examiner* — Stephanie Duclair
(74) *Attorney, Agent, or Firm* — Canon U.S.A., Inc. IP Division

(57) ABSTRACT

An etching method includes etching a silicon substrate with a liquid composition containing an alkaline organic compound, water, and a boron compound with a content in the range of 1% by mass to 14% by mass. The boron compound is at least one of boron sesquioxide, sodium tetraborate, metaboric acid, sodium perborate, sodium borohydride, zinc borate, and ammonium borate.

13 Claims, 1 Drawing Sheet

(51) Int. Cl.
*H01L 21/67* (2006.01)
*C09K 13/10* (2006.01)

(56) References Cited

U.S. PATENT DOCUMENTS

2012/0225563 A1\* 9/2012 Sotoaka ............ H01L 21/30608
438/753
2014/0080313 A1\* 3/2014 Yu ..................... H01L 21/30604
438/749
2015/0147852 A1\* 5/2015 Huang ................... B29C 41/20
438/127

\* cited by examiner

LIQUID COMPOSITION AND ETCHING METHOD FOR ETCHING SILICON SUBSTRATE

BACKGROUND OF THE INVENTION

Field of the Invention

The present application relates to a liquid composition and an etching method for etching a silicon substrate.

Description of the Related Art

For forming through holes and recesses in a silicon substrate, wet etching using a liquid composition can be applied. Japanese Patent Laid-Open No. 2010-278371 discloses a wet etching process using an alkaline organic compound and water.

In general, it takes a long time to etch a silicon substrate by a wet process. Shorter etching time is desirable. In addition, if the silicon substrate has a member made of an aluminum or aluminum alloy, such as a conductive line, the member should be prevented from being etched with a liquid composition. To deal with these issues, Japanese Patent Laid-Open No. 2009-206335 discloses an etching method in which a silicon substrate is etched with a liquid composition containing an alkaline organic compound and a silicon compound.

SUMMARY OF THE INVENTION

According to an aspect of the present application, an etching method is provided which includes etching a silicon substrate with a liquid composition containing an alkaline organic compound, water, and a boron compound with a content in the range of 1% by mass to 14% by mass. The boron compound is at least one selected from boron sesquioxide, sodium tetraborate, metaboric acid, sodium perborate, sodium borohydride, zinc borate, and ammonium borate.

Another aspect of the application provides a liquid composition capable of etching a silicon substrate. The liquid composition contains an alkaline organic compound, water, and a boron compound with a content in the range of 1% by mass to 14% by mass. The boron compound is at least one selected from boron sesquioxide, sodium tetraborate, metaboric acid, sodium perborate, sodium borohydride, zinc borate, and ammonium borate.

Further features of the present invention will become apparent from the following description of exemplary embodiments with reference to the attached drawings.

DESCRIPTION OF THE EMBODIMENTS

Figure 1A:
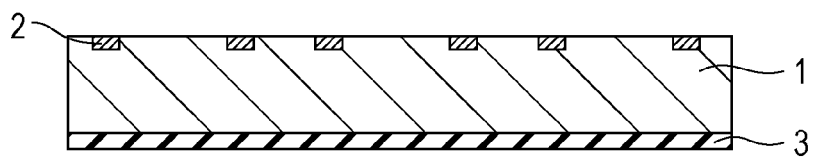
FIGS. 1A to 1G illustrate a process for etching a silicon substrate with a liquid composition.

According to a study by the present inventors, the etching using the liquid composition disclosed in Japanese Patent Laid-Open No. 2010-278371 is performed at a low etching rate. A higher etching rate is desirable. On the other hand, the liquid composition disclosed in Japanese Patent Laid-Open No. 2009-206335 enables a silicon substrate to be etched at a higher etching rate. This etching rate is however not on a satisfactory level, and a still higher etching rate is desirable. In addition, in the use of this liquid composition, the difference in etching rate between the silicon substrate and the silicon oxide film generally used as the etching mask is not sufficient to form holes having a desired shape in the substrate or to work the substrate as desired.

In an embodiment of the application, silicon substrates can be favorably etched at a higher etching rate with the liquid composition.

An embodiment of the present embodiment provides an etching method for etching a silicon substrate with a liquid composition. The silicon substrate will first be described. The silicon substrate is a substrate made of silicon. For anisotropic etching, a monocrystalline silicon substrate is used. Desirably, two opposing surfaces, or the front and rear sides, of the monocrystalline silicon substrate are oriented in the (100) plane. At least one of the front and rear sides is provided with an etching mask thereon, and the liquid composition is introduced through the openings formed in the etching mask, thereby forming holes in the silicon substrate. Although the etching mask may be a silicon oxide or polymer film, a silicon oxide film is advantageous.

The silicon substrate may include an aluminum or aluminum alloy member. For example, if the silicon substrate is used as the substrate of a liquid ejection head, an aluminum conductive line is disposed on the front side of the silicon substrate. In this instance, the silicon substrate may be etched from the rear side with the liquid composition.

The liquid composition contains an alkaline organic compound, water and a boron compound.

The alkaline organic compound is not particularly limited as long as it is so alkaline to etch the silicon substrate, and examples thereof include tetramethylammonium hydroxide (TMAH) and tetraethylammonium hydroxide. The alkaline organic compound content in the liquid composition may be in the range of 5% by mass to 25% by mass. The alkaline organic compound with a content of 5% by mass or more allows the liquid composition to maintain the etching performance thereof. Advantageously, the alkaline organic compound content is 10% by mass or more. The alkaline organic compound with a content of 25% by mass or less increases the etching rate. Advantageously, the alkaline organic compound content is 22% by mass or less.

The liquid composition of the present embodiment contains a boron compound. Advantageously, the boron compound is soluble in water. Examples of the boron compound include boron sesquioxide ($B_2O_3$), sodium tetraborate ($Na_2B_4O_7$), metaboric acid, sodium perborate, sodium borohydride, zinc borate, and ammonium borate. The boron compound content in the liquid composition is in the range of 1% by mass to 14% by mass. When the boron compound content is 1% by mass or more, the etching rate of the silicon substrate increases, while aluminum members and aluminum conductive lines are prevented from being etched. Also, when the boron compound content in the liquid composition is 14% by mass or less, the etching rate of the silicon substrate increases. This suggests that the etching rate of the silicon substrate decreases when the boron compound content is less than 1% by mass or more than 14% by mass. Preferably, the boron compound content in the liquid composition is in the range of 5% by mass to 14% by mass. More preferably, it is in the range of 12% by mass to 14% by mass.

The liquid composition may further contain a silicon compound. Advantageously, the silicon compound is soluble in an aqueous solution of the alkaline organic compound. Examples of the silicon compound include silicon, silicon monoxide, silicon dioxide, orthosilicic acid, metasilicic acid, metadisilicic acid, sodium silicate, disodium silicate, and potassium silicate. If the liquid composition contains a silicon compound, the silicon compound content is desirably 10% by mass or less from the viewpoint of allowing the boron compound to function sufficiently, and allowing for the change of properties of the liquid composition. More desirably, the silicon compound content is 7% by mass or less, such as 6% by mass or less. For adjusting the silicon compound content, for example, the entire or part of the liquid composition may be subjected to crystallization or ion exchange. Advantageously, the total content of the boron compound and the silicon compound in the liquid composition is in the range of 5% by mass to 14% by mass. When it is 5% by mass or more, the etching rate of the silicon substrate increases, while aluminum members and aluminum conductive lines are prevented from being etched. Also, when it is 14% by mass or less, the etching rate of the silicon substrate increases. The total content of the boron compound and the silicon compound in the liquid composition is desirably in the range of 12% by mass to 14% by mass.

The etching method of the present embodiment may be applied to an operation for forming holes or the like in a silicon substrate. The silicon substrate to be worked may be intended for use in, for example, a liquid ejection head, a thermal sensor, a pressure sensor, and an acceleration sensor. The use of the liquid composition allows the silicon substrate to be etched from either side, for example, from the side provided with an aluminum or aluminum alloy conductive line.

A process for etching the silicon substrate of a liquid ejection head will now be described, by way of example, with reference to FIGS. 1A to 1G.

As shown in FIG. 1A, a silicon substrate 1 is prepared which includes energy generating elements 2 in the front side thereof. The rear side of the silicon substrate 1 is provided with a silicon oxide film 3 thereon. The both sides of the silicon substrate 1 are desirably oriented in the (100) plane, and hence the silicon substrate 1 is desirably monocrystalline. The energy generating elements 2 are made of TaSiN or the like, and each element is provided with a conductive line (not shown) made of aluminum or the like on the surface thereof, through which electric power is supplied to the energy generating element. The silicon oxide film may be formed by natural oxidation, or artificial oxidation using a sputtering apparatus or the like.

Figure 1B:
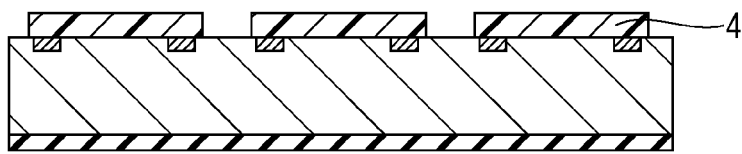
Figure 1C:
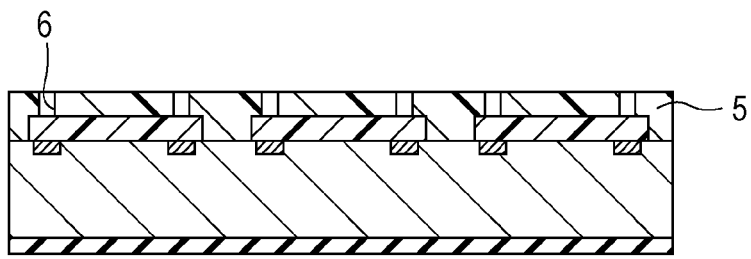

Turning to FIG. 1B, a flow channel pattern 4 is formed on the front side of the silicon substrate 1. The flow channel pattern 4 may be formed by applying a positive photosensitive polymer to the surface of the silicon substrate, and exposing, heating and developing the photosensitive polymer. Subsequently, a flow channel member 5 is formed so as to cover the flow channel pattern 4, as shown in FIG. 1C. The flow channel member 5 may be formed by applying a negative photosensitive polymer so as to cover the flow channel pattern 4, and exposing, heating and developing the photosensitive polymer. Thus, ejection openings 6 are formed in the flow channel member 5.

Figure 1D:
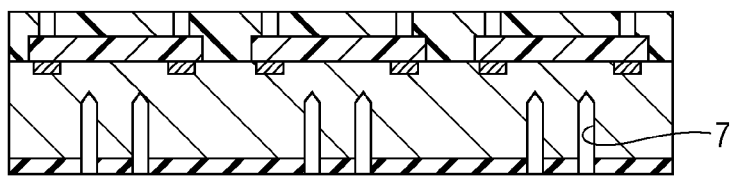

Then, holes 7 passing through the silicon oxide film 3 are formed in the rear side of the silicon substrate 1, as shown in FIG. 1D. The holes 7 are formed with a laser beam or by dry etching. The holes 7 each extend into the silicon substrate 1, but do not penetrate the substrate so as to reach the surface. The holes 7 need not be formed. For example, the silicon oxide film 3 may have openings in which the rear side of the silicon substrate 1 is exposed.

Figure 1E:
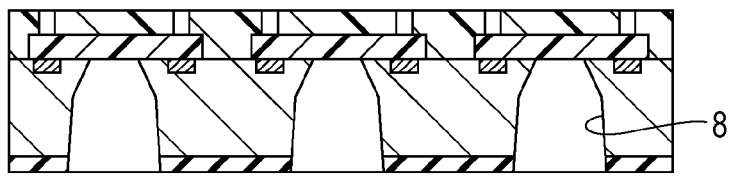

Subsequently, the silicon substrate 1 is etched with the liquid composition, as shown in FIG. 1E. In this instance, the silicon oxide film 3 functions as an etching mask. The liquid composition enters through the holes 7 and reaches the front side of the silicon substrate 1. In the case of not forming the holes 7, etching starts at the portions of the rear side of the silicon substrate 1 exposed in the openings in the silicon oxide film 3 and reaches the front side. Thus, holes 8 are formed. Holes 8 are intended as supply ports of the liquid ejection head. For the etching, the temperature of the liquid composition is desirably in the range of 40° C. to 100° C., from the viewpoint of the etching rate of the silicon substrate. More desirably, it is in the range of 70° C. to 95° C. While the liquid composition is being fed, the front side including the flow channel member 5 and other members may be protected with a cyclized rubber or a tape. Alternatively, the silicon substrate 1 and the chamber are sealed so that only the surface to be treated can come into contact with the liquid composition. In either case, however, there is a risk that the liquid composition having reached the front side comes into contact with the aluminum conductive line or the like.

Figure 1F:
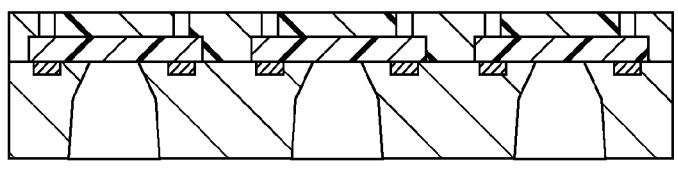

After etching the silicon substrate 1, the silicon oxide film 3 is removed, as shown in FIG. 1F. For this removing operation, the silicon substrate 1 may be immersed in a solution in a wet process, or may be treated with an etching gas in a dry process.

Figure 1G:
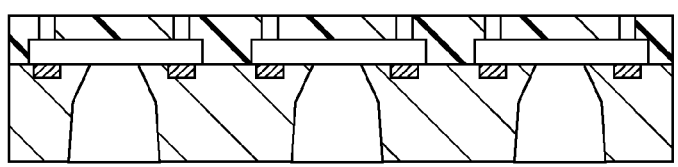

Subsequently, the flow channel pattern 4 is removed to form flow channels, as shown in FIG. 1G. Finally, the silicon substrate 1 is divided into individual chips. To each chip are bound a conductive line for driving the corresponding energy generating element 2 and a chip tank from which the liquid is fed.

EXAMPLES

Silicon substrates were etched with liquid compositions shown in the Table. Each liquid composition contained water, and the total mass thereof was 100%.

Monocrystalline silicon substrates whose front and rear sides are oriented in the (100) plane were uses as the silicon substrates. The rear side of the silicon substrate was provided with a silicon oxide film thereon, and openings were formed in the silicon oxide film so as to be used as an etching mask. For etching, the liquid composition was heated to 88° C., and the silicon substrate was immersed in the liquid composition for 1 hour. Then, after the silicon substrate was rinsed with ultrapure water, the etching rate of the silicon substrate was calculated from the thicknesses of the silicon substrate before and after etching.

Furthermore, an aluminum conductive line was formed on the silicon substrate, and the silicon substrate was immersed in the liquid composition for 10 minutes. At this time, the temperature of the liquid composition was 88° C. Then, after the silicon substrate was rinsed with ultrapure water, the etching rate of aluminum was calculated from the thicknesses of the conductive line before and after etching.

TABLE

| | Alkaline organic compound | | Boron compound | | Silicon compound | | Silicon substrate etching rate | Aluminum etching rate |
|---|---|---|---|---|---|---|---|---|
| | Compound | (mass %) | Compound | (mass %) | Compound | (mass %) | (μm/min) | (μm/min) |
| Example 1 | TMAH | 18 | $B_2O_3$ | 2 | Si | 0 | 1.0 | 6.5 |
| Example 2 | TMAH | 18 | $B_2O_3$ | 5 | Si | 0 | 1.2 | 5.4 |

TABLE-continued

|  | Alkaline organic compound | | Boron compound | | Silicon compound | | Silicon substrate etching rate (μm/min) | Aluminum etching rate (μm/min) |
| --- | --- | --- | --- | --- | --- | --- | --- | --- |
|  | Compound | (mass %) | Compound | (mass %) | Compound | (mass %) | | |
| Example 3 | TMAH | 18 | $B_2O_3$ | 12 | Si | 0 | 1.3 | <0.1 |
| Example 4 | TMAH | 18 | $B_2O_3$ | 14 | Si | 0 | 1.0 | <0.1 |
| Example 5 | TMAH | 18 | $B_2O_3$ | 5 | Si | 1 | 0.7 | 4.5 |
| Example 6 | TMAH | 18 | $B_2O_3$ | 11 | Si | 1 | 0.8 | <0.1 |
| Example 7 | TMAH | 18 | $B_2O_3$ | 14 | Si | 1 | 0.5 | <0.1 |
| Example 8 | TMAH | 18 | $B_2O_3$ | 1 | Si | 7 | 0.6 | <0.1 |
| Example 9 | TMAH | 18 | $B_2O_3$ | 5 | Si | 7 | 0.7 | <0.1 |
| Example 10 | TMAH | 18 | $B_2O_3$ | 10 | Si | 7 | 0.6 | <0.1 |
| Example 11 | TMAH | 5 | $B_2O_3$ | 11 | Si | 1 | 1.0 | <0.1 |
| Example 12 | TMAH | 25 | $B_2O_3$ | 11 | Si | 1 | 0.7 | <0.1 |
| Example 13 | TMAH | 18 | $Na_2B_4O_7$ | 11 | Si | 1 | 0.8 | <0.1 |
| Example 14 | TMAH | 18 | $B_2O_3$ | 11 | $SiO_2$ | 1 | 0.8 | <0.1 |
| Comparative Example 1 | TMAH | 18 | $B_2O_3$ | 0 | Si | 0 | 0.8 | 8.1 |
| Comparative Example 2 | TMAH | 18 | $B_2O_3$ | 15 | Si | 0 | <0.1 | <0.1 |

The Table shows that the liquid composition containing an alkaline organic compound, water, and 1% to 14% by mass of a boron compound can favorably etch the silicon substrate at a high etching rate. On the other hand, the liquid composition having a boron compound content of less than 1% by mass exhibits unfavorable etching as fast as more than 8.0 μm/min, as shown in Comparative Example 1, where aluminum was etched at 8.1 μm/min. Also, as shown in Comparative Example 2, when the boron compound content in the liquid composition exceeds 14% by mass, the etching rate of the silicon substrate decreases to less than 0.1 μm/min.

According to an embodiment of the present application, a silicon substrate can be favorably etched at a higher etching rate with a liquid composition.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-148110, filed Jul. 18, 2014, which is hereby incorporated by reference herein in its entirety.

What is claimed is:

1. An etching method comprising:
   etching a silicon substrate to form a through hole with a liquid composition containing an alkaline organic compound, water, and a boron compound with a content in the range of 1% by mass to 14% by mass, the boron compound being at least one selected from the group consisting of boron sesquioxide, sodium tetraborate, metaboric acid, sodium perborate, sodium borohydride, zinc borate, and ammonium borate,
   wherein the silicon substrate has a member made of at least one of aluminum and an aluminum alloy.

2. The etching method according to claim 1, wherein the content of the boron compound in the liquid composition is in the range of 5% by mass to 14% by mass.

3. The etching method according to claim 1, wherein the content of the boron compound in the liquid composition is in the range of 12% by mass to 14% by mass.

4. The etching method according to claim 1, wherein the liquid composition contains a silicon compound.

5. The etching method according to claim 4, wherein the content of the silicon compound in the liquid composition is 7% by mass or less.

6. The etching method according to claim 4, wherein the total content of the boron compound and the silicon compound in the liquid composition is in the range of 5% by mass to 14% by mass.

7. The etching method according to claim 4, wherein the silicon compound is at least one selected from the group consisting of silicon, silicon monoxide, silicon dioxide, orthosilicic acid, metasilicic acid, metadisilicic acid, sodium silicate, disodium silicate, and potassium silicate.

8. The etching method according to claim 1, wherein the alkaline organic compound is tetramethylammonium hydroxide.

9. The etching method according to claim 1, wherein the etching of the silicon substrate uses an etching mask made of silicon oxide.

10. The etching method according to claim 1, wherein the etching etches the silicon substrate at a rate of 0.5 μm/min or greater.

11. The etching method according to claim 1, wherein the etching etches the aluminum member at a rate of 6.5 μm/min or less.

12. The etching method according to claim 1, wherein the etching etches the silicon substrate at a rate of 0.5 μm/min to 1.3 μm/min.

13. The etching method according to claim 1, wherein the etching etches the aluminum member at a rate of less than 0.1 μm/min to 6.5 μm/min.

* * * * *